(12) United States Patent
Oh et al.

(10) Patent No.: US 12,506,131 B2
(45) Date of Patent: Dec. 23, 2025

(54) DISPLAY MODULE AND DISPLAY APPARATUS INCLUDING THE SAME

(71) Applicant: Samsung Electronics Co., Ltd., Suwon-si (KR)

(72) Inventors: Kihun Oh, Suwon-si (KR); Gwanghyun Jung, Suwon-si (KR); Yonghee Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 546 days.

(21) Appl. No.: 17/956,134

(22) Filed: Sep. 29, 2022

(65) Prior Publication Data

US 2023/0027671 A1  Jan. 26, 2023

Related U.S. Application Data

(63) Continuation of application No. PCT/KR2022/012265, filed on Aug. 17, 2022.

(30) Foreign Application Priority Data

Dec. 2, 2021  (KR) .................. 10-2021-0170583

(51) Int. Cl.
*H01L 25/16* (2023.01)
*H01L 23/00* (2006.01)
(Continued)

(52) U.S. Cl.
CPC ........ *H01L 25/167* (2013.01); *H01L 23/5386* (2013.01); *H01L 24/16* (2013.01);
(Continued)

(58) Field of Classification Search
CPC ... H01L 23/5386; H01L 25/167; H01L 24/16; H01L 25/0753; H01L 24/17;
(Continued)

(56) References Cited

U.S. PATENT DOCUMENTS 10,210,795 B2  2/2019  Kim et al.
10,573,227 B2  2/2020  Gu et al.
(Continued)

FOREIGN PATENT DOCUMENTS

CN  109411455 A  3/2019
EP  4 170 636 A1  4/2023
(Continued)

OTHER PUBLICATIONS

International Search Report and Written Opinion dated Dec. 9, 2022, issued in International Patent Application No. PCT/KR2022/012265.
(Continued)

*Primary Examiner* — Mouloucoulaye Inoussa
(74) *Attorney, Agent, or Firm* — Jefferson IP Law, LLP

(57) ABSTRACT

A display is provided. The display includes a first substrate comprising a plurality of electrode pads disposed on a front surface, a plurality of solder members disposed on a rear surface, and a plurality of wiring members electrically connecting the plurality of electrode pads and the plurality of solder members, respectively, a plurality of light-emitting elements electrically connected to each of the plurality of electrode pads, and constituting pixels of two columns, and a second substrate comprising a thin film transistor (TFT) layer disposed on a rear side of the first substrate and electrically connected to the plurality of solder members to control driving of the plurality of light-emitting elements, and the first substrate may include a first region in which pixels of a first column are disposed, a second region in which pixels of a second column are disposed, and a third region disposed between the first region and the second region, the plurality of wiring members may be disposed on the first region and the second region among the front surface of the first substrate.

20 Claims, 5 Drawing Sheets

(51) Int. Cl.
  *H01L 23/538* (2006.01)
  *H10H 20/857* (2025.01)
(52) U.S. Cl.
  CPC ....... *H10H 20/857* (2025.01); *H01L 23/5384* (2013.01); *H01L 24/17* (2013.01); *H01L 24/29* (2013.01); *H01L 24/32* (2013.01); *H01L 24/73* (2013.01); *H01L 2224/16227* (2013.01); *H01L 2224/17181* (2013.01); *H01L 2224/29147* (2013.01); *H01L 2224/2919* (2013.01); *H01L 2224/32227* (2013.01); *H01L 2224/73204* (2013.01)
(58) Field of Classification Search
  CPC ..... H01L 23/5384; H01L 24/73; H01L 24/29; H01L 24/32; H01L 23/481; H01L 25/075; H01L 2224/73204; H01L 2224/2919; H01L 2224/32227; H01L 2224/29147; H01L 2224/16227; H01L 2224/17181; H01L 2924/181; H01L 2924/12041; H01L 2224/16225; H01L 2924/00014; H01L 2924/1511; H10H 20/857; H10H 20/852; H10H 20/855; H10H 20/831; H10H 20/854; H10H 20/80; H10H 20/85; H10H 20/01; H10H 20/851; H10H 20/0364; G09G 3/323; F21Y 2115/10
  See application file for complete search history.

(56) References Cited

U.S. PATENT DOCUMENTS

| | | |
|---|---|---|
| 11,444,066 B2 | 9/2022 | Jung et al. |
| 2015/0317014 A1 | 11/2015 | Miyake et al. |
| 2017/0025593 A1* | 1/2017 | Bower ................ H01L 25/0753 |
| 2018/0175268 A1* | 6/2018 | Moon ................. H01L 25/0753 |
| 2018/0190184 A1 | 7/2018 | Kim et al. |
| 2018/0358527 A1* | 12/2018 | Mehnert ............. H10H 20/8582 |
| 2019/0012956 A1* | 1/2019 | Li ........................ H01L 25/0753 |
| 2019/0019781 A1 | 1/2019 | Lebrun |
| 2019/0156734 A1 | 5/2019 | Kim et al. |
| 2019/0221604 A1 | 7/2019 | Oh |
| 2019/0305202 A1 | 10/2019 | Sakong et al. |
| 2019/0355294 A1 | 11/2019 | Gu et al. |
| 2020/0083420 A1* | 3/2020 | Gu ....................... H01L 23/5384 |
| 2020/0118988 A1* | 4/2020 | Yueh .................... H10D 86/60 |
| 2020/0212117 A1* | 7/2020 | Jeon ...................... H10K 71/00 |
| 2020/0303607 A1* | 9/2020 | Jang .................. H10H 20/8314 |
| 2021/0043616 A1 | 2/2021 | Jung et al. |
| 2021/0111162 A1* | 4/2021 | Takeya ................ H10H 20/857 |
| 2021/0167047 A1* | 6/2021 | Lee ....................... H01L 25/167 |
| 2021/0193689 A1* | 6/2021 | Hu ........................ H10K 59/18 |
| 2021/0305221 A1* | 9/2021 | Wang ................. H10H 20/857 |
| 2021/0320718 A1* | 10/2021 | Kalman ................. H04B 10/40 |
| 2021/0359187 A1* | 11/2021 | Kwak ................ H10H 20/8506 |
| 2021/0375833 A1 | 12/2021 | Lee et al. |
| 2022/0052230 A1* | 2/2022 | Lin ..................... H01L 23/3135 |
| 2022/0415774 A1* | 12/2022 | Kwon .................... H01L 24/48 |

FOREIGN PATENT DOCUMENTS

| | | |
|---|---|---|
| KR | 10-1461925 B1 | 11/2014 |
| KR | 10-2015-0095415 A | 8/2015 |
| KR | 10-2015-0126558 A | 11/2015 |
| KR | 10-2018-0003700 A | 1/2018 |
| KR | 10-2018-0105834 A | 10/2018 |
| KR | 10-2019-0006430 A | 1/2019 |
| KR | 10-2019-0008124 A | 1/2019 |
| KR | 10-2019-0070038 A | 6/2019 |
| KR | 10-2019-0132907 A | 11/2019 |
| KR | 10-2021-0017674 A | 2/2021 |
| KR | 10-2021-0133777 A | 11/2021 |
| WO | 2019/013469 A1 | 1/2019 |

OTHER PUBLICATIONS

Extended European Search Report dated Nov. 25, 2024, issued in European Patent Application No. 22901502.9.
Korean Office Action dated Mar. 12, 2025, issued in Korean Application No. 10-2021-0170583.
European Search Report dated Oct. 27, 2025, issued in European Application No. 22901502.9.

* cited by examiner

DISPLAY MODULE AND DISPLAY APPARATUS INCLUDING THE SAME

CROSS-REFERENCE TO RELATED APPLICATION(S)

This application is a continuation application, claiming priority under § 365(c), of an International application No. PCT/KR2022/012265, filed on Aug. 17, 2022, which is based on and claims the benefit of a Korean patent application number 10-2021-0170583, filed on Dec. 2, 2021, in the Korean Intellectual Property Office, the disclosure of which is incorporated by reference herein in its entirety.

BACKGROUND

1. Field

The disclosure relates to a display module having an improved wiring structure for improving image quality and saving cost and a display apparatus including the same.

2. Description of the Related Art

A plurality of wiring may be disposed on a substrate to control the quantity of light of a plurality of light emitting elements. However, when the wiring is disposed between the plurality of pixels, there may be a problem in that the wiring is visible to a user, so that the wiring may be recognized as noise and image quality deterioration may occur.

In addition, a Photo Solder Resist (PSR) in black may be applied to the substrate to cover the wiring disposed between the pixels, but there may be a problem that extra process is required and additional cost is necessary.

The above information is presented as background information only to assist with an understanding of the disclosure. No determination has been made, and no assertion is made, as to whether any of the above might be applicable as prior art with regard to the disclosure.

SUMMARY OF THE INVENTION

Aspects of the disclosure are to address at least the above-mentioned problems and/or disadvantages and to provide at least the advantages described below. Accordingly, an aspect of the disclosure is to provide a display module having an improved wiring structure for improving image quality and reducing costs, and a display apparatus including the same.

Additional aspects will be set forth in part in the description which follows and, in part, will be apparent from the description, or may be learned by practice of the presented embodiments.

In accordance with an aspect of the disclosure, a display is provided. The display includes a first substrate comprising a plurality of electrode pads disposed on a front surface, a plurality of solder members disposed on a rear surface, and a plurality of wiring members electrically connecting the plurality of electrode pads and the plurality of solder members, respectively, a plurality of light-emitting elements electrically connected to each of the plurality of electrode pads, and constituting pixels of two columns, and a second substrate comprising a thin film transistor (TFT) layer disposed on a rear side of the first substrate and electrically connected to the plurality of solder members to control driving of the plurality of light-emitting elements, and the first substrate may include a first region in which pixels of a first column are disposed, a second region in which pixels of a second column are disposed, and a third region disposed between the first region and the second region, the plurality of wiring members may be disposed on the first region and the second region among the front surface of the first substrate.

The width of the third region may be 0.3 times to 1.0 time of width of the first region.

The plurality of electrode pads each may include an anode pad electrically connected to anode of the light-emitting element, and a cathode pad electrically connected to cathode of the light-emitting element.

The plurality of solder members may include an anode solder electrically connected to the anode pad and a cathode solder electrically connected to the cathode pad.

The cathode pad may include a first cathode pad corresponding to a first color, a second cathode pad corresponding to a second color, and a third cathode pad corresponding to a third color, and the cathode solder may include a first cathode solder and a second cathode solder corresponding to the first color, a third cathode solder and a fourth cathode solder corresponding to the second color, and a fifth cathode solder and a sixth cathode solder corresponding to the third color.

The plurality of wiring members may include a first wiring member electrically connecting the first cathode solder to the first cathode pad disposed in each of the pixels of the first column, a second wiring member electrically connecting the second cathode solder to the first cathode pad disposed in each of the pixels of the second column, a third wiring member electrically connecting the third cathode solder to the second cathode pad disposed in each of the pixels of the first column, a fourth wiring member electrically connecting the fourth cathode solder to the second cathode pad disposed in each of the pixels of the second column, a fifth wiring member electrically connecting the fifth cathode solder to the third cathode pad disposed in each of the pixels of the first column, and a sixth wiring member electrically connecting the sixth cathode solder to the third cathode pad disposed in each of the pixels of the second column.

The anode pad may include a first anode pad corresponding to the first color and disposed on a right side of the first cathode pad, a second anode pad corresponding to the second color and disposed on a left side of the second cathode pad, and a third anode pad corresponding to the third color and disposed on the left side of the third cathode pad.

The first substrate may include a first via hole through which the first wiring member passes, the first substrate may include a plurality of second via holes adjacently disposed with the pixels of the second column and the second wiring member passes therethrough, the first wiring member may be branched from the first cathode solder on the first region among the front surface of the first substrate via the first via hole and connected to the first cathode pad disposed in each of the pixels of the first column, and the second wiring member may be branched from the second cathode solder on the rear surface of the first substrate and connected to the first cathode pad disposed in each of the pixels of the second column via the plurality of second via holes.

The first substrate may include a plurality of third via holes adjacently disposed with the pixels of the first column and through which the third wiring member passes therethrough, a plurality of fourth via holes adjacently disposed with the pixels of the second column and through which the fourth wiring member passes therethrough, the third wiring member may be branched from the third cathode solder on the rear surface of the first substrate and is connected to the second cathode pads respectively disposed in the pixels of the first column via the plurality of third via holes, and the fourth wiring member may be branched from the fourth cathode solder on the rear surface of the first substrate and is connected to the second cathode pads respectively disposed in the pixels of the second column via the plurality of fourth via holes.

The first substrate may include a plurality of fifth via holes adjacently disposed with the pixels of the first column respectively and through which the fifth wiring member passes, and a sixth via hole through which the sixth wiring member passes, the fifth wiring member may be branched from the fifth cathode solder on the rear surface of the first substrate and is connected to each of the third cathode pad disposed in the pixels of the first column via the plurality of fifth via holes, and the sixth wiring member may be branched from the sixth cathode solder on third region among the front surface of the first substrate and may be connected to the third cathode pad disposed in each of the pixels of the second column via the sixth via hole.

The first cathode solder, the third cathode solder, and the fifth cathode solder may be disposed in the first region, and the second cathode solder, the fourth cathode solder, and the sixth cathode solder may be disposed in the second region.

The first cathode solder CS1, the third cathode solder CS3, and the fifth cathode solder CS5 may be sequentially arranged along a column direction C in the first region, and the sixth cathode solder CS6, the fourth cathode solder CS4, and the second cathode solder CS2 may be sequentially arranged along the column direction C in the second region.

The plurality of wiring members may include an anode wiring member to electrically connect the anode pads respectively disposed in the pixels of a same row and the anode solder.

The pixels of the first column and the second column may be disposed in three rows respectively, the anode solder may include a first anode solder electrically connected to the anode pad respectively disposed in the pixels of a first row, a second anode solder electrically connected to the anode pad respectively disposed in the pixels of a second row, and a third anode solder electrically connected to the anode pad respectively disposed in the pixels of a third row.

In accordance with another aspect of the disclosure, a display apparatus in which a plurality of display components may be disposed in a matrix format, wherein the display is provided. The display apparatus includes a first substrate comprising a plurality of electrode pads disposed on a front surface, a plurality of solder members disposed on a rear surface, and a plurality of wiring members electrically connecting the plurality of electrode pads and the plurality of solder members, respectively, a plurality of light-emitting elements electrically connected to each of the plurality of electrode pads, and constituting pixels of two columns, and a second substrate comprising a thin film transistor (TFT) layer disposed on a rear side of the first substrate and electrically connected to the plurality of solder members to control driving of the plurality of light-emitting elements, the first substrate may include a first region in which pixels of a first column are disposed, a second region in which pixels of a second column are disposed, and a third region disposed between the first region and the second region, the plurality of wiring members may be disposed on the first region and the second region among the front surface of the first substrate.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWING FIGURES

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION OF THE EMBODIMENTS

Figure 1:
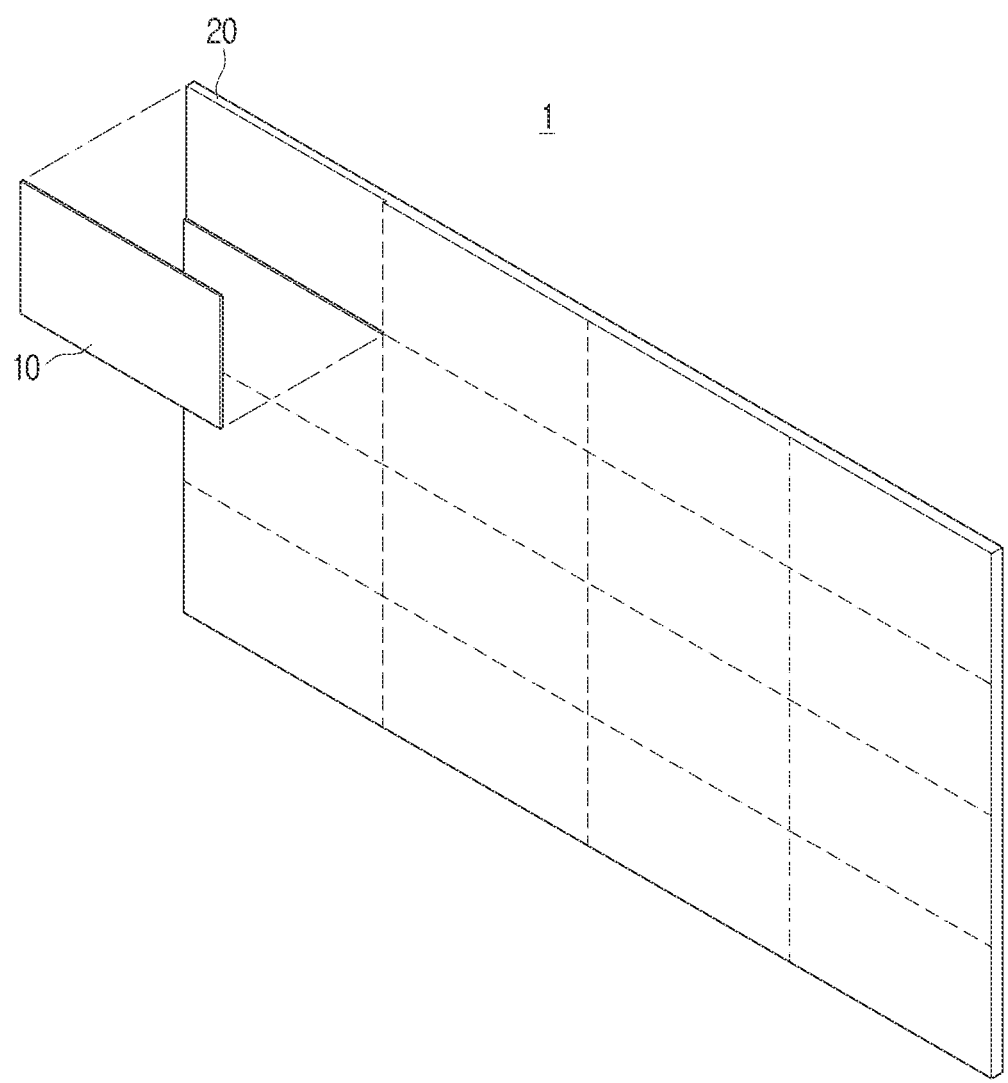
FIG. 1 is a perspective view of a display apparatus according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms such as "first," "second," "third", etc., may be used to describe a variety of elements, but the elements should not be limited by these terms. The terms may be used to distinguish an element from another element. The use of such ordinal numbers should not be construed as limiting the meaning of the term. For example, without departing from the scope of the disclosure, a "first component" may be referred to as a "second component," and similarly, the "second component" may also be referred to as a "first component."

It is to be understood that the terms such as "comprise" may, for example, be used to designate a presence of a characteristic, number, step, operation, element, component, or a combination thereof, and not to preclude a presence or a possibility of adding one or more of other characteristics, numbers, steps, operations, elements, components or a combination thereof.

Terms such as "module," "unit," "part," and so on are used to refer to an element that performs at least one function or operation, and such element may be implemented as hardware or software, or a combination of hardware and software. Further, except for when each of a plurality of "modules," "units," "parts," and the like needs to be realized in an individual hardware, the components may be integrated in at least one module or chip and be realized in at least one processor.

The display module may include a display panel. The display panel may be one of a flat display panel and in the display panel, a plurality of inorganic light emitting diodes (LEDs) having a thickness of 100 µm or less may be arranged. The micro LED display module may provide better contrast, response time and energy efficiency compared to the liquid crystal display (LCD) panel requiring backlight. Organic light emitting diode (OLED) and a micro LED, which may be an inorganic LED, both have good energy efficiency, but the micro LED has better brightness, luminous efficiency, and lifespan than the OLED. The micro LED may be a semiconductor chip capable of emitting light by itself when power is supplied. Micro LEDs 50 may have fast response rate, low power consumption, and high luminance. Specifically, micro LEDs may be more efficient in converting electricity into photons as compared to related-art liquid crystal displays (LCDs) and organic light-emitting diode (OLED) displays. That is, "brightness per Watt" may be greater as compared to related-art LED (width, length, and height each exceeds 100 µm) or OLED displays. The micro LEDs may provide a similar brightness as LCD or OLED displays while consuming substantially half as much energy as such displays. In addition to the foregoing, micro LEDs may be capable of providing high resolution, outstanding color, contrast and brightness, may accurately provide a wide range of colors, and may provide a clear screen even in the outdoors under direct and bright sunlight. In addition, micro LEDs may be resistant to burn-in phenomenon, and generate less heat, thereby improving product lifespan and reducing deformation. The micro LED may have a flip chip structure in which an anode electrode and a cathode electrode may be formed on the same first surface and a light emitting surface may be formed on a second surface opposite to the first surface on which the electrodes may be formed. Alternatively, the micro LED may have an anode electrode and a cathode electrode disposed on the light emitting surface of the micro LED, respectively. The micro LEDs may have the anode electrode and the cathode electrode to be located on facing sides or opposite to each other.

The micro LED may have an anode electrode and a cathode electrode disposed on the light emitting surface and the side surface of the micro LED, respectively. The anode electrode of the micro LED may extend from the light emitting surface to the side, and the cathode electrode of the micro LED may also extend from the light emitting surface to the side surface. The micro LEDs may be located on facing sides or opposite to each other.

The glass substrate may include a thin film transistor (TFT) layer having a thin film transistor (TFT) circuit formed on a front surface thereof, and a driving circuit for driving the TFT thin film circuit on the rear surface thereof. The TFT circuit may drive a plurality of pixels disposed in the TFT layer. The front surface of the glass substrate may be divided into an active region and an inactive region. The active region may correspond to an area occupied by the TFT layer on the front surface of the glass substrate, and the inactive region may be an area excluding an area occupied by the TFT layer on the front surface of the glass substrate.

The edge region of the glass substrate may be the outermost of the glass substrate. The edge region of the glass substrate may be the remaining region except for the region in which the circuit of the glass substrate may be formed. The edge region of the glass substrate may also include a side surface of the glass substrate and a portion of the front surface of the glass substrate adjacent to the side surface and a portion of the rear surface of the glass substrate. The glass substrate may be formed of a quadrangle type. The glass substrate may be formed of rectangular or square shape. The edge region of the glass substrate may include at least one of four sides of the glass substrate.

The substrate applied to the display module according to various embodiments of the disclosure need not be limited to a glass substrate, and may be a polymer substrate (e.g., a polyimide substrate) or a ceramic substrate.

The display module according to various embodiments of the disclosure may be installed and applied to wearable devices, portable devices, handheld devices in a single unit, and electronic products or electronic parts requiring various displays, and may be applied to display devices such as monitors for personal computer (PC), high-resolution televisions (TVs) and signage (or digital signage), electronic displays, etc. through a plurality of assembly layouts, as a matrix type.

Embodiments of the disclosure will be described in detail with reference to the accompanying drawings to aid in the understanding of those of ordinary skill in the art. However, the disclosure may be realized in various different forms and it should be noted that the disclosure is not limited to the various embodiments described herein. Further, in the drawings, parts not relevant to the description may be omitted, and like reference numerals may be used to indicate like elements.

Embodiments of the disclosure will be described in detail with reference to the accompanying drawings and the descriptions of the accompanying drawings, but the disclosure is not limited or restricted by the embodiments.

Hereinafter, a display apparatus according to various embodiments of the disclosure will be described with reference to the drawings.

FIG. 1 is a perspective view of a display apparatus according to an embodiment of the disclosure.

Referring to FIG. 1, a display apparatus 1 according to an embodiment of the disclosure may include a plurality of display modules (i.e. components) 10 arranged in a matrix form. The display apparatus 1 may implement a large area screen by tiling a plurality of display modules 10 on which a plurality of micro-light emitting elements may be transferred to a substrate and installing the display module 10 on the cabinet 20.

The display apparatus 1 according to another embodiment may be implemented as a TV, but is not limited thereto, and may be implemented as a device having a display device such as a video wall, large format display (LFD), digital signage, digital information display (DID), projector display. The display apparatus 100 may be implemented as a display of various types such as, for example, and without limitation, a liquid crystal display (LCD), organic light emitting diodes (OLED) display, liquid crystal on silicon (Lcos), digital light processing (DLP), quantum dot (QD) display, quantum dot light-emitting diodes (QLED), micro light-emitting diodes (µLED), mini LED, or the like. The display apparatus 100 may be implemented as a touch screen coupled to a touch sensor, a flexible display, a rollable display, a three-dimensional (3D) display, a display in which a plurality of display modules may be physically connected, or the like.

Figure 2:
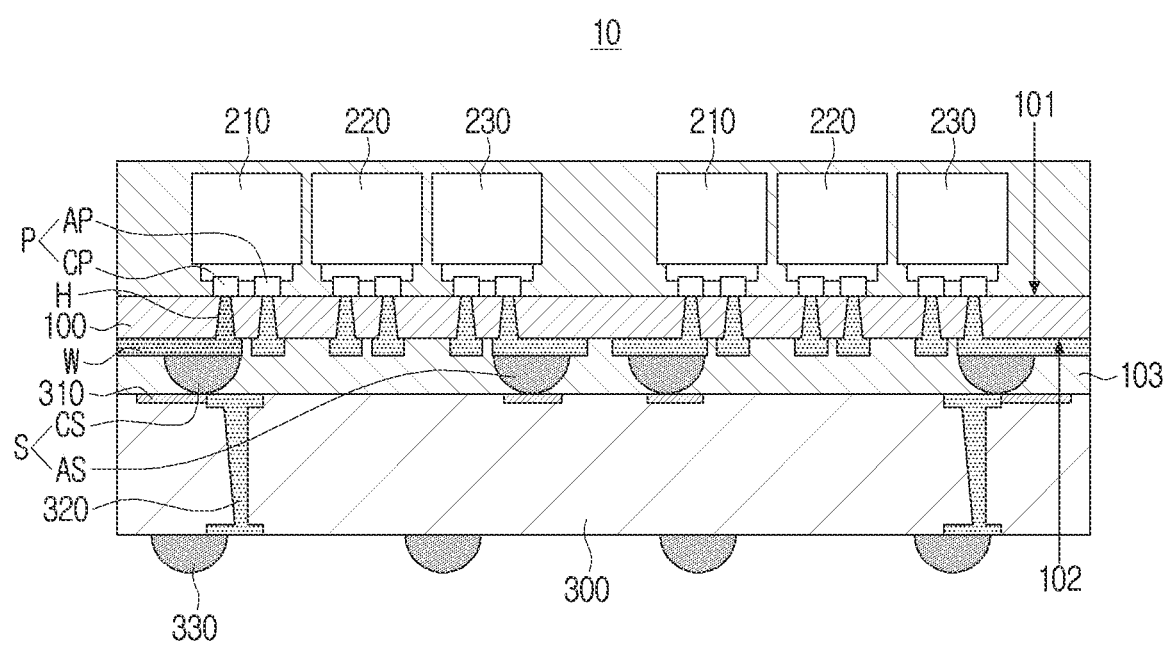
FIG. 2 is a cross-sectional diagram of a display module according to an embodiment of the disclosure.

FIG. 2 is a cross-sectional diagram of a display module according to an embodiment of the disclosure.

Referring to FIG. 2, the display module 10 according to an embodiment may include the first substrate 100, a plurality of light-emitting elements 200, and a second substrate 300.

The first substrate 100 may include a plurality of electrode pads P, a plurality of solder members S, and a plurality of wiring members W.

The plurality of electrode pads P may be disposed on a front surface 101 of the first substrate 100. The plurality of electrode pads P may include a pair of anode pads AP and a cathode pad CP, respectively, for one light emitting element 200. The anode pad AP may be electrically connected to the anode of the light emitting element 200, and the cathode pad CP may be electrically connected to the cathode of the light emitting element 200.

The anode pad AP and the cathode pad CP may be made of a conductive material such as metal, and may be exposed from the insulating layer to be electrically connected to another electrode. When a driving current is applied to an anode of the light emitting element 200 through an anode pad AP, and current flows from an anode of the light emitting element 200 to a cathode, the light emitting element 200 emits light.

According to an embodiment, the plurality of solder members S may be disposed on the rear surface 102 of the first substrate 100. The solder member S may be a solder electrode (e.g., a solder ball) formed by a soldering process.

According to another embodiment, the plurality of solder members S may include an anode solder AS electrically connected to an anode pad AP and a cathode solder CS electrically connected to the cathode pad CP.

According to yet another embodiment, the plurality of solder members S may be spaced apart from each other, and bonding members 103 may fill the spaced portion therebetween. The bonding member 103 may be disposed between the first substrate 100 and the second substrate 300 and may be attached to a front surface facing the first substrate 100 of the second substrate 300.

The bonding member 103 may be attached to one surface of the second substrate 300 by coating or laminating prior to heat treatment. For example, the bonding member 103 may be formed of a film shape made of synthetic resin or a metal sheet such as copper, and may be thermally processed in a state of being attached to the front surface of the second substrate 300.

The plurality of wiring members W may electrically connect the plurality of electrode pads P and the plurality of solder members S, respectively. The plurality of wiring members W may connect the electrode pad P disposed on the front surface 101 of the first substrate 100 and the solder member S disposed on the rear surface 102 of the first substrate 100 by penetrating the via hole H formed in the first substrate 100.

The wiring member W may be formed on the first substrate 100 by a FOPLP process. The FOPLP process may include forming a via hole H using a laser on the rear surface 102 of the first substrate 100, filling the via hole H with a wiring member W (e.g., a metal such as copper) using a plating process, and forming a wiring member W through a photolithography process after plating the rear surface 102 of the first substrate 100. The first substrate 100 may be referred to as a redistributed printed circuit board. In the plating process, the conductive material filling the via hole H may include at least one of Cu, Sn, Sn—Ag alloy, or Sn—Ag—Cu alloy.

According to an embodiment, the plurality of light emitting elements 200 may be electrically connected to the plurality of electrode pads P, respectively. The cathode of the light emitting element 200 may be connected to the cathode pad CP, and the anode of the light emitting element 200 may be connected to an anode pad AP.

According to another embodiment, the plurality of light emitting elements 200 may include a first light emitting element 210, a second light emitting element 220, and a third light emitting element 230. The first light emitting element 210 may emit red light, the second light emitting element 220 may emit blue light, and the third light emitting element 230 may emit green light. The first to third light emitting elements 210, 220, and 230 may constitute one pixel.

The second substrate 300 may be disposed on a rear direction of the first substrate 100. The second substrate 300 may include a TFT layer (not shown) electrically connected to a plurality of solder members S for controlling driving of the plurality of light emitting elements 200.

The first substrate 100 may function as a relay substrate and the second substrate 300 may function as a driving substrate. Since the plurality of light emitting apparatuses 200 are not directly mounted on the second substrate 300 and electrically connected to the second substrate 300 through the first substrate 100, the yield may be improved.

The second substrate 300 may be manufactured by a process of making a transistor capable of controlling each pixel. The second substrate 300 having the TFT structure may be an active element capable of maintaining a desired voltage until a next switch-on time after supplying a desired voltage to the pixel at a time when the switch may be turned on and a pixel may be completely isolated at the time when a switch may be turned off. The second substrate 300 may utilize a substrate material that may be easy to form a high-temperature TFT, such as ceramic, glass, silicon, or the like.

Each connection pad 161 of the second substrate 160 may be exposed to a front surface of the second substrate 160. One end of the conductive material portion 162 may be electrically connected to the connection pad 161, and the other end of the conductive material portion 162 may be exposed to the rear surface of the second substrate 160. An additional solder member 330 may be formed at the other end of the conductive material portion 162. For example, the additional solder member 330 may include at least one solder electrode (e.g., a solder ball) formed by a soldering process. The additional solder member 330 may be electrically connected to a module bridge substrate disposed behind the display module 10. The additional solder member 330 may be electrically connected to the first substrate 100 through a via wiring 320 and a connection wiring 310 of the second substrate 160. The connection wiring 310 of the second substrate 160 may be connected to the cathode solder CS of the first substrate 100.

Figure 3:
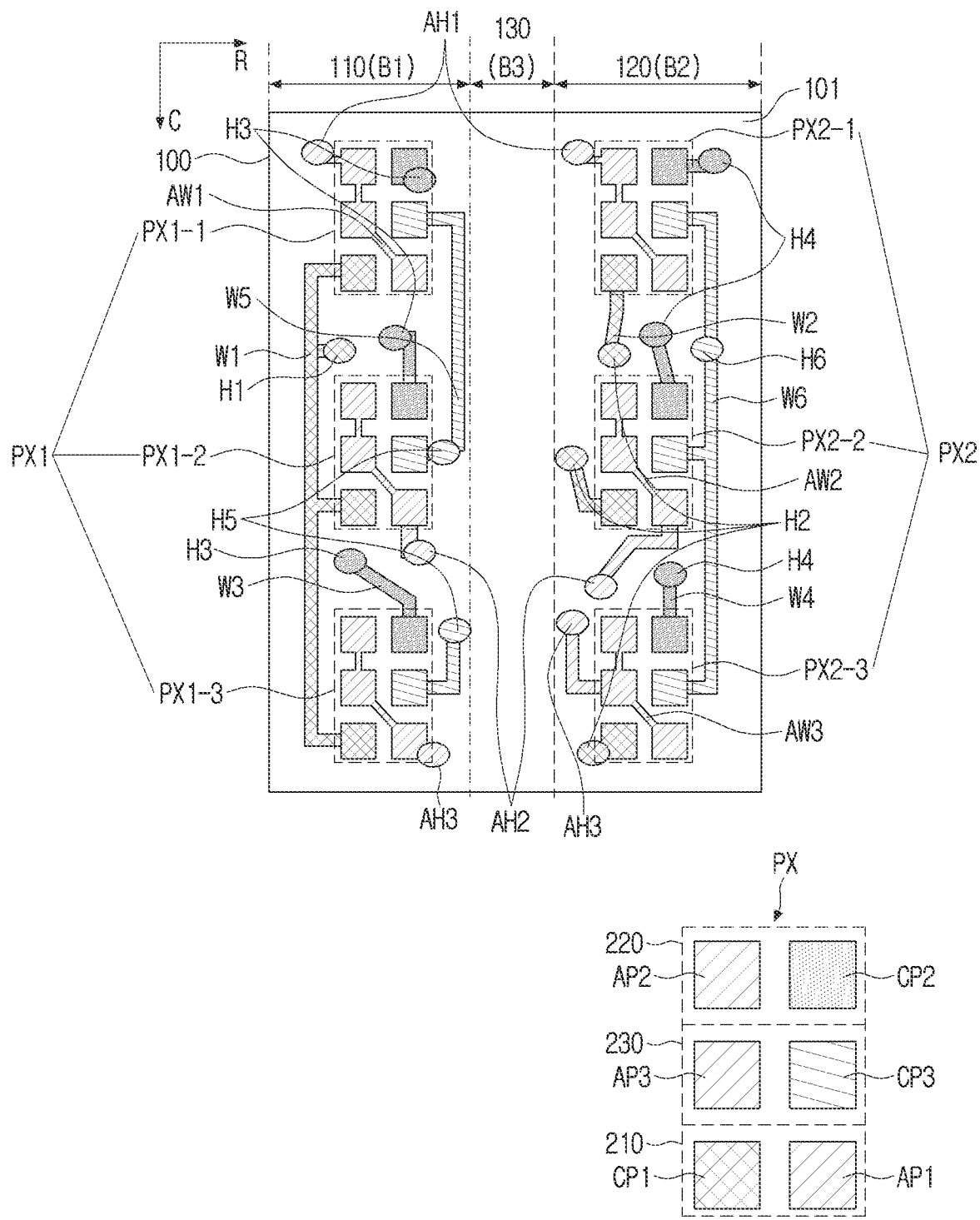
FIG. 3 is a front diagram of a first substrate according to an embodiment of the disclosure.

FIG. 3 is a front diagram of a first substrate according to an embodiment of the disclosure.

Figure 4:
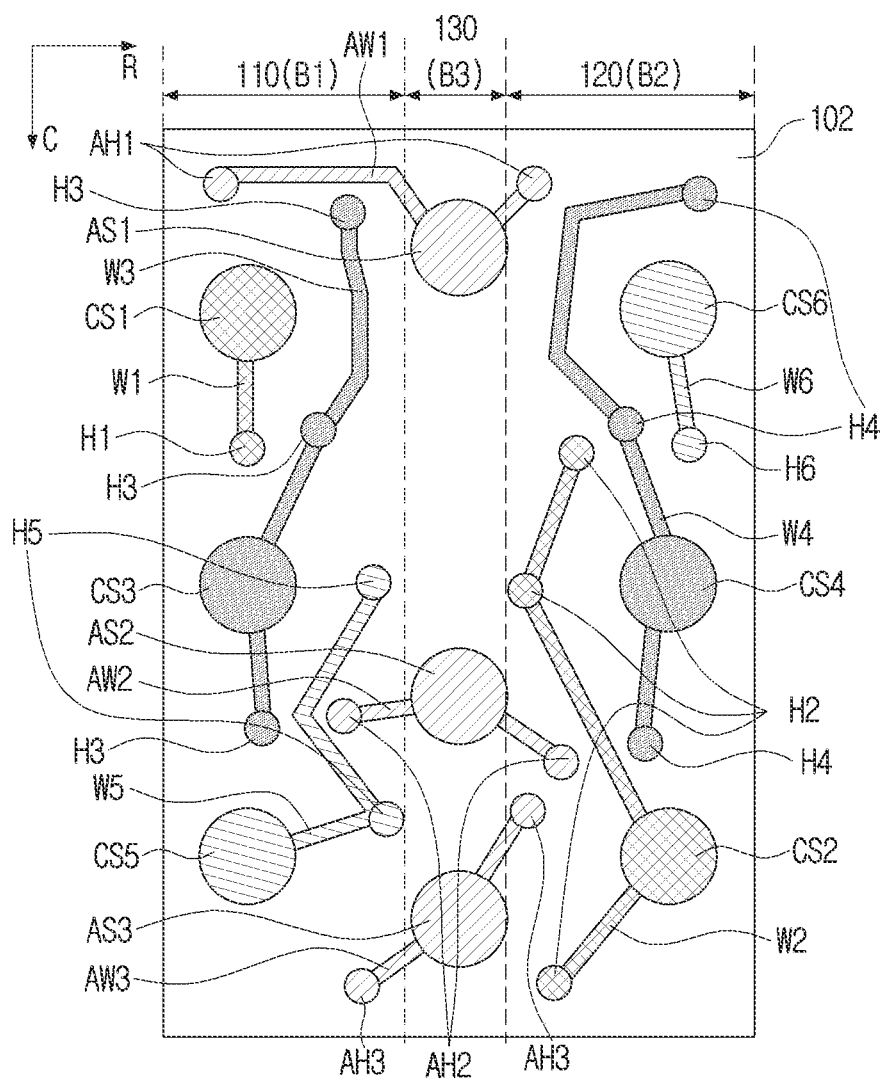
FIG. 4 is a back diagram of a first substrate according to an embodiment of the disclosure.

FIG. 4 is a back diagram of a first substrate according to an embodiment of the disclosure.

Referring to FIGS. 3 and 4, the plurality of light emitting elements 200 may constitute two rows of pixels in the front surface 101 of the first substrate 100. For example, a plurality of pixels may include pixels PX1 in a first column and pixels PX2 in a second column. The pixels PX1 in the first column and the pixels PX2 in the second column may be spaced apart from each other by a predetermined distance along the row direction R.

The pixels PX1 of the first column may include a first pixel PX1-1, a second pixel PX1-2, and a third pixel PX1-3 sequentially arranged along a column direction C. The second row pixels PX2 may include a fourth pixel PX2-1, a fifth pixel PX2-2, and a sixth pixel PX2-3 sequentially arranged along a column direction C. The pixels PX1 of the first column and the pixels PX2 of the second column may be arranged in three rows, respectively, and the front surface 101 of the display module 10 may be composed of pixels in three rows and two columns. However, the arrangement and the number of pixels are not limited thereto.

The first substrate 100 may include a first region 110 in which pixels PX1 of a first column may be disposed, a second region 120 in which pixels PX2 of a second column may be disposed, and a third region 130 disposed between the first region 110 and the second region 120. The first region 110, the third region 130, and the second region 120 may be sequentially disposed along the row direction R.

The length in column direction C of the first to third regions 110, 120, 130 may be the same as the length in the column direction C of the first substrate 100. The first substrate 100 may be divided into three including the first region 110, the third region 130, and the second region 120 along the row direction R.

The plurality of wiring members W may be disposed on the first region 110 and the second region 120 among the front surface 101 of the first substrate 100. The plurality of wiring members W may not be disposed on the third region 130 among the front surface 101 of the first substrate 100.

Accordingly, since the plurality of wiring members W are not visible to the user located in front of the display module 10 as much as possible, the image quality may be improved. There may be no need to apply a photo solder resist (PSR) of black to cover the wiring member W on the front surface 101 of the first substrate 100, so the process may be simplified and the manufacturing cost may be reduced.

The width B3 of a third region 130 may be 0.3 times to 1.0 time of the width B1 of the first region 110. The width B2 of the second region 120 may be the same as the width B1 of the first region 110 but is not limited thereto.

The one pixel PX may include a first light emitting element 210 emitting light of a first color, a second light emitting element 220 emitting light of a second color, and a third light emitting element 230 emitting light of a third color. The first color may be red, the second color may be blue, and the third color may be green, but the embodiment is not limited thereto. In one pixel PX, the second light emitting element 220, the third light emitting element 230, and the first light emitting element 210 may be sequentially arranged along a column direction.

The cathode pad CP may include a first cathode pad CP1 corresponding to a first color, a second cathode pad CP2 corresponding to a second color, and a third cathode pad CP3 corresponding to a third color. The first cathode pad CP1 may be connected to the cathode of the first light emitting element 210, the second cathode pad CP2 may be connected to the cathode of the second light emitting element 220, and the third cathode pad CP3 may be connected to the cathode of the third light emitting element 230.

The anode pad AP may include a first anode pad AP1 corresponding to a first color, a second anode pad AP2 corresponding to a second color, and a third anode pad AP3 corresponding to a third color. The first anode pad AP1 may be connected to the anode of the first light emitting element 210, the second anode pad AP2 may be connected to the anode of the second light emitting element 220, and the third anode pad AP3 may be connected to the anode of the third light emitting element 230.

The first anode pad AP1 may be disposed on the right side of the first cathode pad CP1. The second anode pad AP2 may be disposed on the left side of the second cathode pad CP2. The third anode pad AP3 may be disposed on the left side of the third cathode pad CP3. The right side refers to the row direction R, and the left side may refer to the opposite direction of the row direction R.

Referring to the rear surface 102 of the first substrate 100, the cathode solder CS may include a first cathode solder CS1 and a second cathode solder CS2 corresponding to a first color, a third cathode solder CS3 and a fourth cathode solder CS4 corresponding to a second color, a fifth cathode solder CS5 and a sixth cathode solder CS6 corresponding to a third color.

According to an embodiment, the first cathode solder CS1, the third cathode solder CS3, and the fifth cathode solder CS5 may be disposed in the first region 110. The second cathode solder CS2, the fourth cathode solder CS 4, and the sixth cathode solder CS 6 may be disposed in the second region 120.

According to another embodiment, the first cathode solder CS1, the third cathode solder CS3, and the fifth cathode solder CS5 may be sequentially arranged along a column direction C in the first region 110. The sixth cathode solder CS6, the fourth cathode solder CS4, and the second cathode solder CS2 may be sequentially arranged along a column direction C in the second region 120.

The plurality of wiring members W may include first to sixth wiring members W1, W2, W3, W4, W5, and W6. The first to sixth wiring members W1, W2, W3, W4, W5, and W6 may not intersect each other.

The first wiring member W1 may electrically connect the first cathode solder CS1 to the first cathode pad CP1 disposed in the first column of pixels PX1.

The second wiring member W2 may electrically connect the second cathode solder CS2 to the first cathode pad CP1 disposed in the second column of pixels PX2.

The third wiring member W3 may electrically connect the third cathode solder CS3 to the second cathode pad CP2 disposed in each of the first column of pixels PX1.

The fourth wiring member W4 may electrically connect the fourth cathode solder CS4 to the second cathode pad CP2 disposed in each of the second column of pixels PX2.

The fifth wiring member W5 may electrically connect the fifth cathode solder CS5 to the third cathode pad CP3 disposed in each of the first column of pixels PX1.

The sixth wiring member W6 may electrically connect the sixth cathode solder CS6 to the third cathode pad CP3 disposed in each of the second column of pixels PX2.

The first to sixth wiring members W1, W2, W3, W4, W5, and W6 may be arranged in the same column and may connect the cathode pads CP corresponding to the same color to each other.

The plurality of wiring members W may include an anode wiring member AW to electrically connect the anode pads AP respectively disposed in the pixels of a same row and the anode solder AS.

The anode solder AS may include a first anode solder AS1, a second anode solder AS2, and a third anode solder AS3.

The first anode solder AS1 may be electrically connected to the anode pads AP disposed in each of first row pixels PX1-1, PX2-1.

The second anode solder AS2 may be electrically connected to the anode pads APs disposed in each of second row pixels PX1-2, PX2-2.

The third anode solder AS3 may be electrically connected to the anode pads APs disposed in each of third row pixels PX1-3, PX2-3.

The anode wiring member AW may include the first anode wiring member AW1, the second anode wiring member AW2, and the third anode wiring member AW3.

The first anode wiring member AW1 may be connected to an anode pad AP of the first pixel PX1-1 and the fourth pixel PX2-1 via two first anode via holes AH1 after being branched from the first anode solder AS1.

The second anode wiring member AW2 may be connected to an anode pad AP of the second pixel PX1-2 and the fifth pixel PX2-2 via two second anode via holes AH2 after being branched from the second anode solder AS2.

The third anode wiring member AW3 may be connected to an anode pad AP of the third pixel PX1-3 and the sixth pixel PX2-3, respectively, via the two third anode via holes AH3 after being branched from the third anode solder AS3.

The first to third anode wiring members AW1, AW2, and AW3 may connect the anode pads AP disposed in the same row of pixels to each other. The first to third anode wiring members AW1 to AW3 may not intersect with each other and may not intersect the first to sixth wiring members W1, W2, W3, W4, W5, and W6.

The plurality of light emitting elements 200 emitting the same color of the same column may be controlled by different anode pads APs, so as to be controlled for each row with different light amounts. For example, the first light-emitting element 210 disposed in the first pixel PX1-1 and emitting a red color may be controlled by the first anode solder AS1, and the first light-emitting element 210 disposed in the second pixel PX1-2 may be controlled by the second anode solder AS2, so as to be controlled with different amounts of light.

The first substrate may include a first via hole H1 and a plurality of second via holes H2 adjacently disposed with the second column pixels PX2.

The first wiring member W1 may pass through the first via hole H1 and may be branched from the first region 110 among the front surface 101 of the first substrate 100 via the first via hole H1 to be connected to the first cathode pad CP1 disposed in each of the pixels PX1 of the first column.

The second wiring member W2 may pass through the plurality of second via holes H2 and may be branched from the rear surface 102 of the first substrate 100 via the second cathode solder CS2 via a plurality of second holes H2 to be connected to the first cathode pad CP1 disposed in each of the pixels PX2 of the second column.

The first wiring member W1 may be connected to a first cathode pad CP1 disposed in the first column of pixels PX1 after passing through one first via hole H1 and then being branched at a place far away from the third region 130 of the front surface 101 of the first substrate 100.

The second wiring member W2, after being branched on the rear surface 102 of the first substrate 100 to three branches, may be connected to the first cathode pad CP1 disposed in the second column of pixels PX2, respectively, via the three second via holes H2. Since the first cathode pad CP1 disposed in the pixels PX2 of the second column may be disposed adjacent to the third region 130, the second wiring member W2 may be disposed with a minimum section in the front surface 101 of the first substrate 100.

Accordingly, the first and second wiring members W1 and W2 are disposed only in the first and second regions 110 and 120 of the front surface 101 of the first substrate 100, and are not disposed in the third region 130, so that the wiring member W may not be visible to the user between the second column pixels.

The first substrate 100 may include a plurality of third via holes H3 disposed adjacent to the pixels PX1 of the first column, and a plurality of fourth via holes H4 disposed adjacent to the pixels PX2 of the second column.

The third wiring member W3 may pass through the plurality of third via holes H3, may be branched from the third cathode solder CS3 at the rear surface 102 of the first substrate 100 and may be connected to the second cathode pads CP2 disposed in the pixels PX1 of the first column via the plurality of third via holes H3.

The fourth wiring member W4 may pass through the plurality of fourth via holes H4 and may be branched from the fourth cathode solder CS4 at the rear surface 102 of the first substrate 100 to be connected to the second cathode pads CP2 disposed in the pixels PX2 of the second column via the plurality of fourth via holes H4, respectively.

The third wiring member W3 may be connected to the second cathode pad CP2 disposed on the pixels PX1 of the first column via the three third via holes H3 respectively, after being branched from the rear surface 102 of the first substrate 100 to three branches. That is, since the second cathode pad CP2 disposed in the pixels PX1 of the first column may be disposed adjacent to the third region 130, the third wiring member W3 may be disposed at a minimum section from the front surface 101 of the first substrate 100.

In addition, the fourth wiring member W4 may be connected to the second cathode pad CP2 disposed on the pixels PX2 of the second column via the three fourth via holes H4, respectively, after being branched from the rear surface 102 of the first substrate 100 to three branches. The fourth wiring member W4 may be disposed at a minimum section in the front surface 101 of the first substrate 100.

Accordingly, the third and fourth wiring members W3 and W4 are disposed only in the first and second regions 110 and 120 of the front surface 101 of the first substrate 100, and are not disposed in the third region 130, so that the wiring member W may not be visible to the user.

The first substrate 100 may include a plurality of fifth via holes H5 and a sixth via hole H6 disposed adjacent to the pixels PX1 of the first column.

The fifth wiring member W5 may pass through the plurality of fifth via holes H5 and may be branched from the fifth cathode solder CS5 at the rear surface 102 of the first substrate 100 to be connected to the third cathode pads CP3 disposed in the pixels PX1 of the first column.

The sixth wiring member W6 may pass through the sixth via hole H6 and may be connected to a third cathode pad CP3 branched from the third area 120 of the front surface 101 of the first substrate 100 via the sixth via hole H6 from the sixth cathode solder CS6 to be disposed in the pixels PX2 of the second column.

In other words, after the fifth wiring member W5 may be branched on the rear surface 102 of the first substrate 100 to two branches, the fifth wiring member W5 may be connected to the third cathode pad CP3 disposed in the first row of pixels PX1 after passing through the two second via holes H2, respectively, and branched once more on the front surface 101 of the first substrate 100. Since the third cathode pad CP3 disposed in the pixels PX1 of the first column may be disposed adjacent to the third region 130, the fifth wiring member W5 may be disposed at a minimum section from the front surface 101 of the first substrate 100.

The sixth wiring member W6 may be connected to the third cathode pad CP3 disposed on the pixels PX2 of the second column by branching from the third area 130 of the front surface 101 of the first substrate 100 after passing through one sixth via hole H6.

Accordingly, the fifth and sixth wiring members W5 and W6 may be disposed only on the first and second areas 110 and 120 of the front surface 101 of the first substrate 100, and may not be disposed in the third area 130, so that the wiring member W may not be visible to the user.

Figure 5:
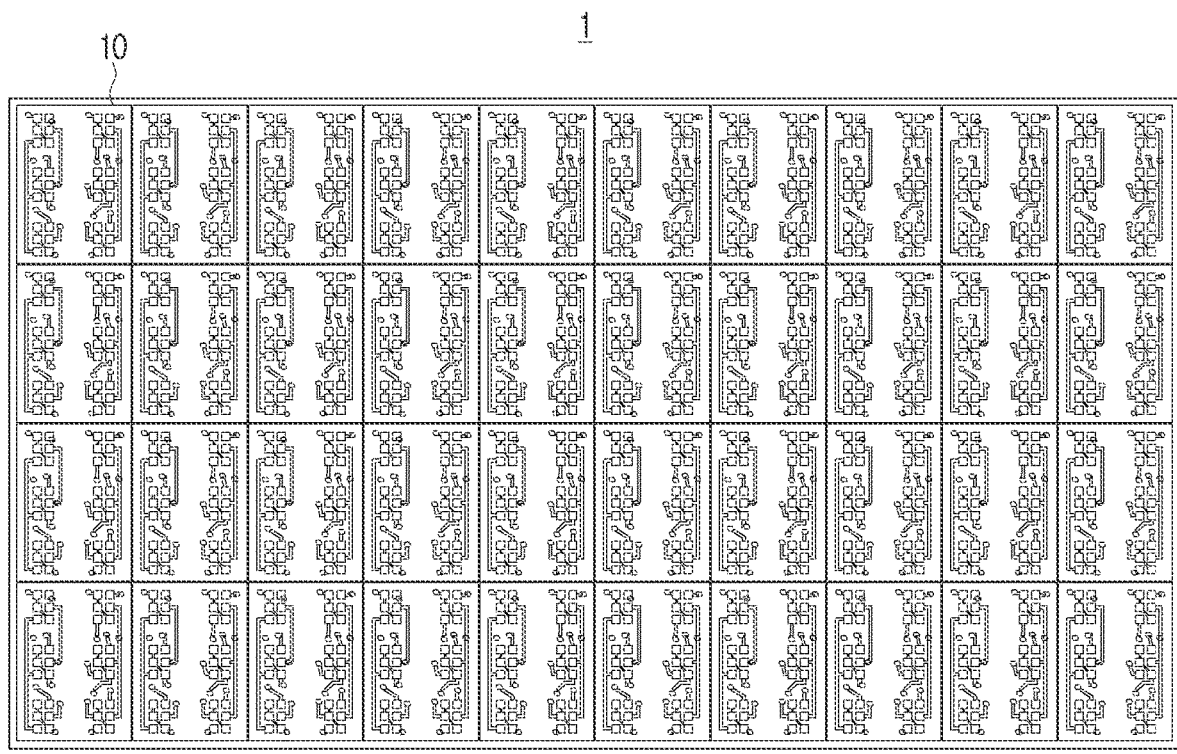
FIG. 5 is a plan diagram of a display apparatus made of a plurality of display modules according to an embodiment of the disclosure.

FIG. 5 is a plan diagram of a display apparatus made of a plurality of display modules according to an embodiment of the disclosure.

Referring to FIG. 5, the display apparatus 1 may be formed by arrangement of a plurality of display modules 10 in the form of a matrix. According to the wiring structure described above, in the display apparatus 1 according to an embodiment of the disclosure, a wiring member may not be disposed in an area between a plurality of pixels.

Accordingly, since the plurality of wiring members are not visible to the user located in front of the display apparatus 1, the image quality may be improved. In addition, since there may be no need to apply a photo solder resist (PSR) of black to cover the wiring member on the front surface of the display module 10, the process may be simplified and the manufacturing cost may be reduced.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display comprising:
    a first substrate comprising:
        a plurality of electrode pads disposed on a front surface,
        a plurality of solder members disposed on a rear surface, and
        a plurality of wiring members electrically connecting the plurality of electrode pads and the plurality of solder members, respectively;
    a plurality of light-emitting elements electrically connected to each of the plurality of electrode pads, and constituting pixels of two columns; and
    a second substrate comprising a thin film transistor (TFT) layer disposed on a rear side of the first substrate and electrically connected to the plurality of solder members to control driving of the plurality of light-emitting elements,
    wherein the first substrate comprises:
        a first region in which pixels of a first column are disposed,
        a second region in which pixels of a second column are disposed, and
        a third region disposed between the first region and the second region,
    wherein the front surface of the first substrate is free from electrical connections in the third region, and
    wherein the plurality of wiring members is disposed on the first region and the second region among the front surface of the first substrate.

2. The display of claim 1, wherein width of the third region is 0.3 times to 1.0 time of width of the first region.

3. The display of claim 1, wherein the plurality of electrode pads each comprise:
    an anode pad electrically connected to an anode of each light-emitting element of the plurality of light-emitting elements; and
    a cathode pad electrically connected to a cathode of each light-emitting element of the plurality of light-emitting elements.

4. The display of claim 3, wherein the plurality of solder members comprise an anode solder electrically connected to the anode pad and a cathode solder electrically connected to the cathode pad.

5. The display of claim 4,
    wherein the cathode pad comprises:
        a first cathode pad corresponding to a first color,
        a second cathode pad corresponding to a second color, and
        a third cathode pad corresponding to a third color, and
    wherein the cathode solder comprises:
        a first cathode solder and a second cathode solder corresponding to the first color,
        a third cathode solder and a fourth cathode solder corresponding to the second color, and
        a fifth cathode solder and a sixth cathode solder corresponding to the third color.

6. The display of claim 5, wherein the plurality of wiring members comprises:
    a first wiring member electrically connecting the first cathode solder to the first cathode pad disposed in each of the pixels of the first column;
    a second wiring member electrically connecting the second cathode solder to the first cathode pad disposed in each of the pixels of the second column;
    a third wiring member electrically connecting the third cathode solder to the second cathode pad disposed in each of the pixels of the first column;
    a fourth wiring member electrically connecting the fourth cathode solder to the second cathode pad disposed in each of the pixels of the second column;
    a fifth wiring member electrically connecting the fifth cathode solder to the third cathode pad disposed in each of the pixels of the first column; and
    a sixth wiring member electrically connecting the sixth cathode solder to the third cathode pad disposed in each of the pixels of the second column.

7. The display of claim 6, wherein the anode pad comprises:
    a first anode pad corresponding to the first color and disposed on a right side of the first cathode pad;
    a second anode pad corresponding to the second color and disposed on a left side of the second cathode pad; and
    a third anode pad corresponding to the third color and disposed on the left side of the third cathode pad.

8. The display of claim 6,
    wherein the first substrate comprises a first via hole through which the first wiring member passes,
    wherein the first substrate comprises a plurality of second via holes adjacently disposed with the pixels of the second column and the second wiring member passes therethrough,
    wherein the first wiring member is branched from the first cathode solder on the first region among the front surface of the first substrate via the first via hole and connected to the first cathode pad disposed in each of the pixels of the first column, and wherein the second wiring member is branched from the second cathode solder on the rear surface of the first substrate and connected to the first cathode pad disposed in each of the pixels of the second column via the plurality of second via holes.

9. The display of claim 6,
wherein the first substrate comprises:
a plurality of third via holes adjacently disposed with the pixels of the first column and through which the third wiring member passes therethrough, and
a plurality of fourth via holes adjacently disposed with the pixels of the second column and through which the fourth wiring member passes therethrough,
wherein the third wiring member is branched from the third cathode solder on the rear surface of the first substrate and is connected to the second cathode pads respectively disposed in the pixels of the first column via the plurality of third via holes, and
wherein the fourth wiring member is branched from the fourth cathode solder on the rear surface of the first substrate and is connected to the second cathode pads respectively disposed in the pixels of the second column via the plurality of fourth via holes.

10. The display of claim 6,
wherein the first substrate comprises:
a plurality of fifth via holes adjacently disposed with the pixels of the first column respectively and through which the fifth wiring member passes, and sixth via hole through which the sixth wiring member passes,
wherein the fifth wiring member is branched from the fifth cathode solder on the rear surface of the first substrate and is connected to each of the third cathode pad disposed in the pixels of the first column via the plurality of fifth via holes, and
wherein the sixth wiring member is branched from the sixth cathode solder on third region among the front surface of the first substrate and is connected to the third cathode pad disposed in each of the pixels of the second column via the sixth via hole.

11. The display of claim 5,
wherein the first cathode solder, the third cathode solder, and the fifth cathode solder are disposed in the first region, and p1 wherein the second cathode solder, the fourth cathode solder, and the sixth cathode solder are disposed in the second region.

12. The display of claim 11,
wherein the first cathode solder, the third cathode solder, and the fifth cathode solder are sequentially arranged along a column direction in the first region, and
wherein the sixth cathode solder, the fourth cathode solder, and the second cathode solder are sequentially arranged along the column direction in the second region.

13. The display of claim 4, wherein the plurality of wiring members comprises an anode wiring member to connect the anode pads respectively disposed in the pixels of a same row and the anode solder.

14. The display of claim 13,
wherein the pixels of the first column and the second column are disposed in three rows respectively, and
wherein the anode solder comprises:
a first anode solder electrically connected to the anode pad respectively disposed in the pixels of a first row,
a second anode solder electrically connected to the anode pad respectively disposed in the pixels of a second row, and
a third anode solder electrically connected to the anode pad respectively disposed in the pixels of a third row.

15. A display apparatus in which a plurality of display components is disposed in a matrix format, the display apparatus comprising:
a first substrate comprising:
a plurality of electrode pads disposed on a front surface,
a plurality of solder members disposed on a rear surface, and
a plurality of wiring members electrically connecting the plurality of electrode pads and the plurality of solder members, respectively;
a plurality of light-emitting elements electrically connected to each of the plurality of electrode pads, and constituting pixels of two columns; and
a second substrate comprising a thin film transistor (TFT) layer disposed on a rear side of the first substrate and electrically connected to the plurality of solder members to control driving of the plurality of light-emitting elements,
wherein the first substrate comprises:
a first region in which pixels of a first column are disposed,
a second region in which pixels of a second column are disposed, and
a third region disposed between the first region and the second region,
wherein the front surface of the first substrate is free from electrical connections in the third region, and
wherein the plurality of wiring members is disposed on the first region and the second region among the front surface of the first substrate.

16. The display apparatus of claim 15, wherein the plurality of solder members includes an anode solder formed by a soldering process and a cathode solder soldering process.

17. The display apparatus of claim 15, wherein the plurality of wiring members is not be disposed on the third region among the front surface of the first substrate.

18. The display apparatus of claim 15, wherein a width of the second region is the same as the width of the first region.

19. The display apparatus of claim 15, wherein a length of the third region is substantially the same as a length of the first and second regions.

20. The display apparatus of claim 15, wherein the display apparatus comprises six pixels disposed in three rows across the first and second columns.

* * * * *